(12) United States Patent
Henrickson

(10) Patent No.: US 7,346,139 B2
(45) Date of Patent: Mar. 18, 2008

(54) CIRCUIT AND METHOD FOR GENERATING A LOCAL CLOCK SIGNAL

(75) Inventor: Lindor E. Henrickson, San Jose, CA (US)

(73) Assignee: Agere Systems Inc., Allentown, PA (US)

( * ) Notice: Subject to any disclaimer, the term of this patent is extended or adjusted under 35 U.S.C. 154(b) by 889 days.

(21) Appl. No.: 10/269,238

(22) Filed: Oct. 11, 2002

(65) Prior Publication Data

US 2004/0070431 A1    Apr. 15, 2004

(51) Int. Cl.
*H04L 7/00* (2006.01)
(52) U.S. Cl. .................. 375/355; 375/327; 375/340; 375/375; 327/158; 327/161
(58) Field of Classification Search ............... 375/355, 375/375, 376, 340, 327; 327/158, 161
See application file for complete search history.

(56) References Cited

U.S. PATENT DOCUMENTS 4,715,050 A * 12/1987 Tanaka et al. ............... 375/362
5,179,303 A * 1/1993 Searles et al. .............. 327/277
5,875,219 A * 2/1999 Kim ........................... 375/376
5,990,714 A * 11/1999 Takahashi .................... 327/149
6,256,362 B1 * 7/2001 Goldman .................... 375/373
6,275,079 B1 * 8/2001 Park ........................... 327/143
6,876,239 B2 * 4/2005 Bell ............................ 327/158

OTHER PUBLICATIONS

"A Portable Digital DLL for High-Speed CMOS Interface Circuits" by Bruno W. Garlepp, et al.; IEEE Journal of Solid-State Circuits, vol. 34, No. 5, May 1999; pp. 632-644.
"A Semidigital Dual Delay-Locked Loop" by Stefanos Sidiropoulos; IEEE Journal of Solid-State Circuits, vol. 32, No. 11, Nov. 1997; pp. 1683-1692.

* cited by examiner

*Primary Examiner*—Ted Wang

(57) ABSTRACT

A circuit and method for generating a local clock signal and a telecommunications system incorporating the circuit or the method. In one embodiment, the circuit includes: (1) a phase detector for receiving an input data signal, (2) (at least) first and second continuously controllable delay lines, coupled to the phase detector, for producing respective first and second candidate local clock signals and (3) delay line selector, coupled to the first and second delay lines, for selecting one of the first and second candidate local clock signals to be the local clock signal based on phase excursions in the input data signal.

15 Claims, 5 Drawing Sheets

CIRCUIT AND METHOD FOR GENERATING A LOCAL CLOCK SIGNAL

TECHNICAL FIELD OF THE INVENTION

The present invention is directed, in general, to phase-locked loops and, more specifically, to a circuit and method for generating a local clock signal.

BACKGROUND OF THE INVENTION

Two ways exist by which data can be communicated from a transmitter to a receiver: asynchronously or synchronously. Data communication is asynchronous when the transmitter and receiver employ separate time bases (clocks). While asynchronous data communication dispenses with the need for a synchronizing master clock signal to be transmitted with the data, the data instead is required to be bounded by control bits and typically buffered at both the transmitting and receiving ends. The control bits and buffering result in an overall reduction in data transmission rate.

Synchronous data communication occurs when the transmitter and receiver share the same time base. Synchronous data communication greatly reduces the need for buffering as described above and may simply utilize control bits for adding quality of service. Synchronous data communication, however, requires a master clock signal to be shared between the transmitter and receiver to ensure that they work harmoniously. While asynchronous communications systems have certainly found their place today, modern telecommunications systems and sophisticated computer networks predominantly use synchronous data communication due to the superior speed it offers.

Unfortunately, communicating a clock signal over distances can be challenging. A clock signal may be encoded in a square waveform and may be transmitted many miles over an electrical wire, optical fiber or wirelessly. The clock signal may be distributed with synchronous data or via a separate master clock network. In addition, the clock signal may be embedded within the synchronous data and extracted when needed. During its transmission, interference and transmission line impairments may serve to attenuate, disperse, distort and/or frequency-shift the clock signal, rendering it difficult to use or perhaps even to recognize at its destination.

Accordingly, it has become commonplace to employ circuits either to regenerate the master clock signal or use it merely to synchronize a local clock. Such local clock generating circuits often employ a phase-locked loop (PLL).

Modern communication systems demand high clock rates (to support rapid data communication) and high quality clock signals (often measured in terms of frequency excursion, or "jitter") Modern communication standards typically specify low jitter bandwidths with respect to actual data rates which are employed. Accordingly, today's local clock generating circuits have grown more complex and expensive. Complicating matters is that the circuits may be called upon to generate local clock signals over a broad spectrum of frequencies. Such circuits should therefore be "frequency-agile."

To date, several different approaches have been tried in an effort to achieve inexpensive, reliable, frequency-agile local clock signal generating circuits. One approach uses a relatively narrow bandwidth PLL in combination with a voltage-controlled crystal oscillator (VCXO). Although having the ability to generate high purity low noise clock signals, VCXOs cannot be integrated with PLLs on the same chip, are expensive and are not frequency-agile in the least. For such circuits to attain frequency agility, they must employ multiple VCXOs, one for each narrow band of clock frequency they may be called upon to generate. This further raises their cost and complexity.

Another approach employs a PLL in combination with a multi-tap delay-locked loop (DLL). DLLs are far less expensive than VCXOs and can be integrated into the same chip as PLLs. Further, their multiple taps yield frequency agility. Unfortunately, this type of PLL/DLL circuit does not have the spectral purity of a VCXO. Further, since each tap provides a discrete (noncontinuous) clock phase, hopping among the taps (as happens when the master clock frequency jitters) introduces quantization jitter into the local clock signal. For a fixed number of phase taps, the proportion of jitter induced by tap-hopping increases as frequency increases. Jitter can be held to within acceptable ranges only by decreasing the phase difference between each tap. However this requires the number of DLL taps to increase, forcing the clock signal generating circuit as a whole to be larger and more complex, expensive and power consumptive. Additionally, an increase in the number of DLL taps may restrict the maximum operational frequency of the local clock signal generating circuit.

Accordingly, what is needed in the art is a fundamentally new architecture for a local clock generating circuit. The circuit should ideally be integratable into a single chip, frequency-agile, introduce only acceptably low jitter, and should avoid the expensive, discrete-component VCXOs and low spectral purity or complex, many-tapped DLLs of the prior art.

SUMMARY OF THE INVENTION

To address the above-discussed deficiencies of the prior art, the present invention provides a circuit and method for generating a local clock signal and a telecommunications system incorporating the circuit or the method. In one embodiment, the circuit includes: (1) a phase detector for receiving an input data signal, (2) (at least) first and second continuously controllable delay lines, coupled to the phase detector, for producing respective first and second candidate local clock signals and (3) delay line selector, coupled to the first and second delay lines, for selecting one of the first and second candidate local clock signals to be the local clock signal based on phase excursions in the input data signal. Of course one skilled in the pertinent art will understand that phase excursions of the input data signal will result in a frequency excursion of the input data signal. For the purpose of the present invention, "input data signal" is defined as an input clock signal or a random data signal of synchronous data having an embedded input clock signal.

The present invention therefore introduces a local clock signal generating circuit that produces a local clock signal over a wide range of potential frequencies without requiring multiple voltage-controlled crystal oscillators which are relatively expensive. Rather than relying on a single delay line to compensate over multiple clock cycles, the present invention introduces the concept of using multiple delay lines having limited compensation ranges (one clock cycle, in an embodiment to be illustrated and described) and selection circuitry to toggle between the delay lines as necessary as phase excursions occur.

In one embodiment of the present invention, the phase detector is a linear phase detector that produces a phase offset signal based on both the input data signal and the local clock signal. Of course, the present invention is operable with phase detectors of any conventional or later-discovered type including phase detectors which are random data tolerant. A random data tolerant phase detector is capable of producing the phase offset signal when receiving a random data signal or an input clock signal. Those skilled in the pertinent art will understand the operation and configuration of a random data tolerant phase detector.

In one embodiment of the present invention, each of the first and second delay lines comprises a resettable integrator for determining a delay therein. In an embodiment to be illustrated and described, the resettable integrator is capable of integrating within a range of values representing a single clock cycle.

In one embodiment of the present invention, the delay line selector comprises a cycle slip detector for detecting when an active one of the first and second delay lines has reached a delay limit. In an embodiment to be illustrated and described, the cycle slip detector advantageously detects when the integrator of the active delay line has reached its upper or lower limits.

In one embodiment of the present invention, the delay line selector comprises a flip-flop for generating a selection signal. In a related embodiment, the delay line selector employs the selection signal to reset a resettable integrator in a nonselected one of the first and second delay lines. In an embodiment to be illustrated and described, an inverted form of the selection signal is employed to reset a resettable integrator in the selected one of the first and second delay lines when it becomes nonselected.

In one embodiment of the present invention, the delay line selector comprises a multiplexer for selecting the one of the first and second candidate local clock signals based on a state of a selection signal. Those skilled in the pertinent art understand the structure and function of multiplexers and their advantageous use in the context of the present invention.

The present invention further introduces a method of generating a local clock signal and a synchronous telecommunications system employing a circuit constructed according to the principles of the present invention to generate a local clock signal and thereby allow processing of synchronous data received from a remote source.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
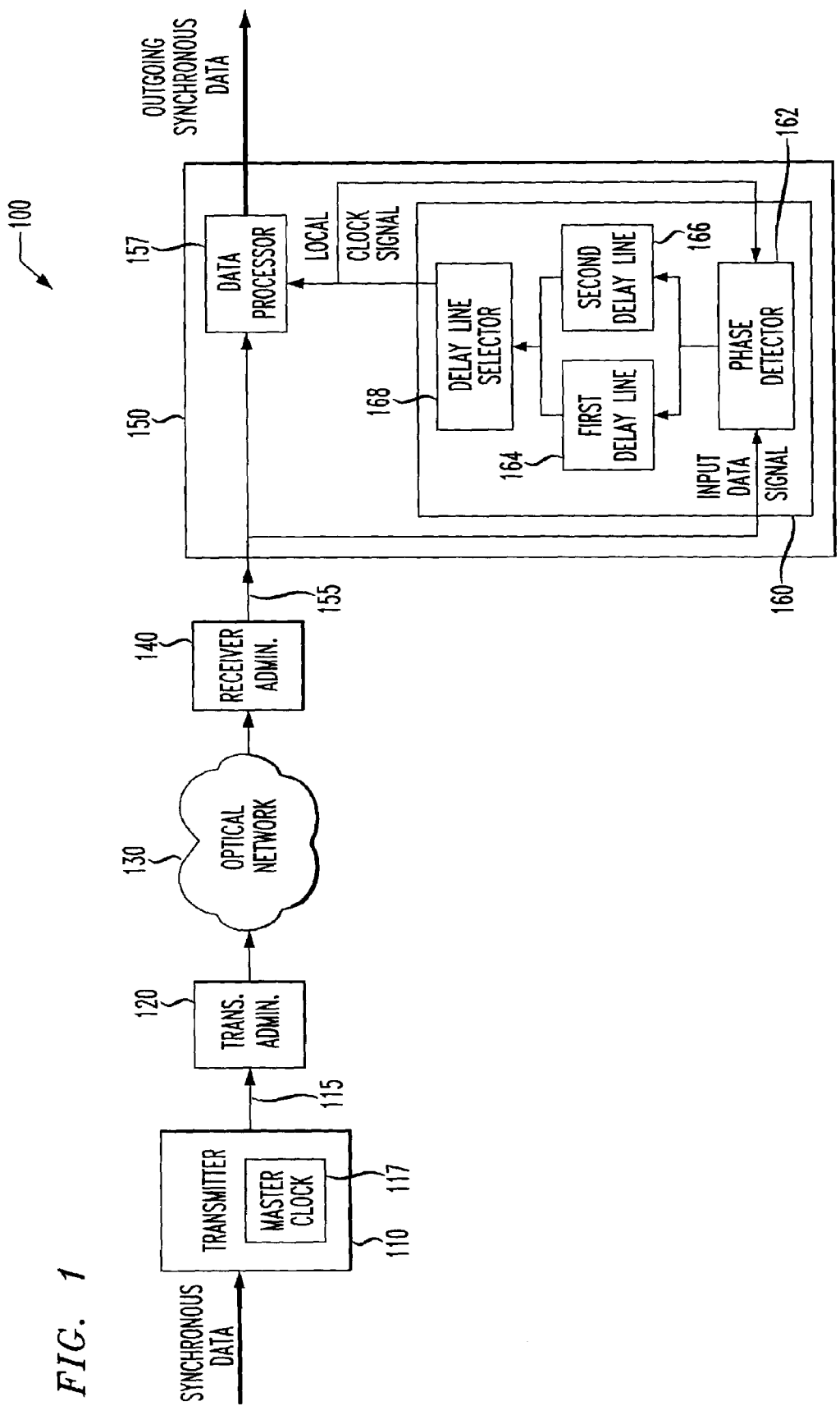
FIG. 1 illustrates a synchronous telecommunications system that forms one environment within which a local clock generating circuit constructed according to the principles of the present invention may advantageously operate.

Referring initially to FIG. 1, illustrated is a synchronous telecommunication system, generally designated 100, that forms one environment within which a local clock generating circuit 160, constructed according to the principles of the present invention, may advantageously operate. The synchronous telecommunications system 100 specifically addresses the optical transmission of synchronous data. One skilled in the pertinent art, however, will understand that the local clock generating circuit 160 may advantageously operate in other synchronous telecommunications system employing various modes of transmission besides optical fiber including wireless, electrical wire or any combination of the three.

The synchronous telecommunications system 100 includes a transmitter 110 having a transmit data channel 115, a transmitter administrator 120, an optical network 130, a receiver administrator 140 and a receiver 150 having a receive data channel 155. The transmitter 110 includes a master clock 117. The receiver 150 includes a data processor 157 and the local clock generating circuit 160. The local clock generating circuit 160 includes a phase detector 162, a first delay line 164, a second delay line 166 and a delay line selector 168.

The transmitter 110 receives synchronous data and provides a transmit data channel 115 to the transmit administrator 120. The synchronous data may be digital information including music, voice or computer data. The transmit data channel 115 may be a single data channel or may be a plurality of parallel data channels. The transmitter 110 sends the synchronous data via the transmit data channel 115 to the transmitter administrator 120. The transmitter administrator 120 manages the conversion of the synchronous data from electrical data signals into optical data signals suitable for transmission over the optical network 130. The transmitter 110 and the transmitter administrator 120 process the synchronous data based on an input clock signal from the master clock 117. To insure the synchronous data is processed with the same time base during transmission and reception, the transmitter 110 may send the input clock signal with the synchronous data to the optical network 130. In some embodiments, the input clock signal may be sent through a separate master clock network. In other embodiments, the transmitter may embed the input clock signal within the synchronous data for extraction before processing of the synchronous data. Of course, components of the optical network 130 may also employ a local clock generating circuit to insure a harmonious clock signal with the master clock 117 for synchronous processing.

The optical network 130 may transmit the synchronous data and the input clock signal from the transmitter administrator 120 to the receiver administrator 140. The optical network 130 may vary in length depending on the remoteness of the receiver 150. The optical network 130 may be established within a single building. In other embodiments, the optical network 130 may provide long distance transmission between the receiver 150 remotely located from the transmitter 110. The receiver 150, for example, may be remotely located across town, in another city or in another state.

The rate of operation of the optical network 130 may also vary. For example, the synchronous telecommunications system 100 may support various Synchronous Optical Network (SONET) transmission rates ranging from about 51 Mb per second to about 40 Gb per second. Accordingly, the input clock signal of the master clock 117 will vary to control the synchronous processing of the various transmission rates.

The receiver administrator 140 receives the synchronous data and input clock signal and manages the conversion from optical data signals into electrical data signals for use by the receiver 150. In another synchronous telecommunications system, the synchronous data and the input clock signal may be received by other circuitry instead of the receiver administrator 140. For example, a receiving circuit may be a radio frequency front end of a radio frequency receiver. In the synchronous telecommunications system 100, the receiver administrator 140 sends the synchronous data and the input clock signal to the receiver 150 via the receive data channel 155. In some embodiments, the input clock signal may be embedded in the synchronous data. The receive data channel 155 may be a single data channel or may be a plurality of parallel data channels.

The receiver 150 employs the data processor 157 to process the received synchronous data resulting in outgoing synchronous data. The data processor 157 processes the received synchronous data based on a local clock signal generated by the local clock generating circuit 160. The local clock signal is generated to correspond with the input clock signal of the master clock 117 and insure the same time base at the receiver 150 and the transmitter 110. Due to the difficulty in constructing precisely independent matched clocks remotely located from each other, the input clock signal may be employed to provide a necessary coupling to the master clock 117. Even though the input clock signal was transmitted with the synchronous data, the local clock signal is used since the input clock signal may have been altered during transmission. For example, the input clock signal may have accumulated jitter from components of the optical network 130.

The phase detector 162 receives an input data signal via the receive data path 155. The input data signal may be the input clock signal from the master clock 117 that was received with the synchronous data. In another embodiment, the input data signal may be a random data signal. For example, the input data signal may be the synchronous data with the input clock signal embedded.

The phase detector 162 may be a linear phase detector which receives the input clock signal from the master clock 117 via the optical network 130. The phase detector 162 may also be a random data tolerant phase detector that is capable of receiving a random data signal and extracting the input clock signal. The phase detector 162 may receive the local clock signal and produce a phase offset signal based on both the input clock signal and the local clock signal. The phase detector 162 may produce the phase offset signal by comparing a phase of the local clock signal to the phase of the input clock signal or, in some embodiments, to a phase of a random data signal. The phase detector 162 sends the phase offset signal, which indicates phase excursions in the input clock signal, to the first delay line 164 and the second delay line 166.

The first delay line 164 and the second delay line 166, coupled to the phase detector 162, produce a first and second candidate local clock signal, respectively. In a preferred embodiment, the first delay line 164 and the second delay line 166 may include a resettable integrator for determining a delay. In some embodiments, the first delay line 164 and the second delay line 166 may include a high order control element. At any point in time, either the first delay line 164 or the second delay line 166 may be selected to provide the first or second candidate local clock signal as the local clock signal. The first delay line 164 and the second delay line 166 may employ a reference clock signal to provide the first and second candidate local clock signals. Both the first delay line 164 and the second delay line 166 are coupled to the delay line selector 168.

The delay line selector 168 selects one of the first and second candidate local clock signals to be the local clock signal based on the phase excursions in the input clock signal. The delay line selector 168 may include a cycle slip detector for detecting when an active one of the first delay line 164 and the second delay line 166 has reached a delay limit. In addition, the delay line selector 168 may include a toggle flip-flop for generating a selection signal. The delay line selector 168 may employ the selection signal to reset a resettable integrator in a nonselected one of the first delay line 164 or second delay line 166. The delay line selector 168 may include a multiplexor which selects the first or second candidate local clock signal based on a state of the selection signal.

Figure 2:
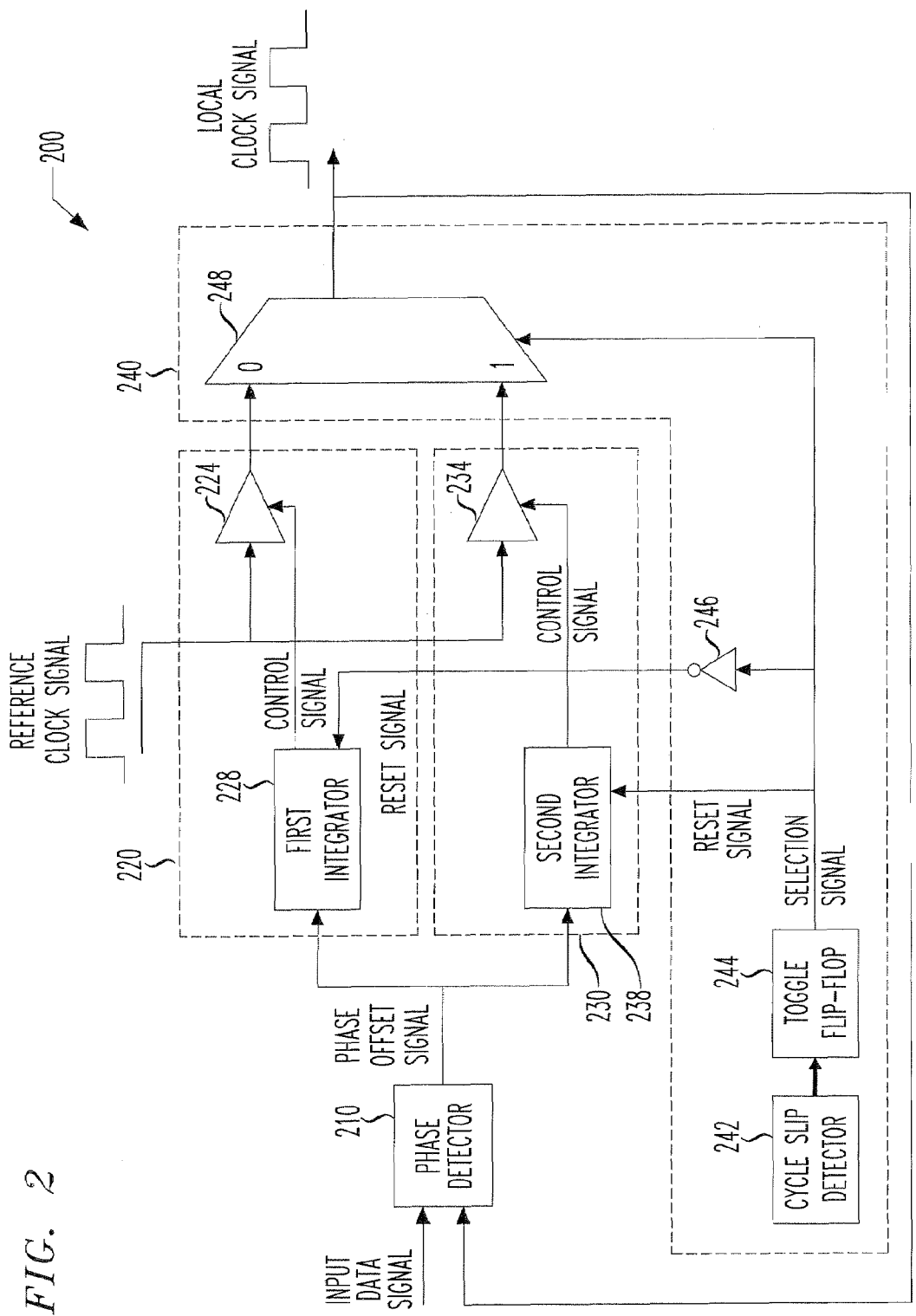
FIG. 2 illustrates a block diagram of a local clock generating circuit constructed according to the principles of the present invention.

Turning now to FIG. 2, illustrated is a block diagram of a local clock generating circuit, generally designated 200, constructed according to the principles of the present invention. The local clock generating circuit 200 includes a phase detector 210, a first delay line 220, a second delay line 230 and a delay line selector 240. The first delay line 220 includes a first delay element 224 and a first integrator 228. The second delay line 230 includes a second delay element 234 and a second integrator 238. The delay line selector 240 includes a cycle slip detector 242, a toggle flip-flop 244, an invertor 246 and a multiplexor 248.

The phase detector 210 may be a linear phase detector that produces a phase offset signal based on both an input data signal and a local clock signal. In some embodiments, the input data signal may an input clock signal. In other embodiments, the input data signal may be a random data signal with the input clock signal embedded therein. For example, the phase detector 210 may be a random data tolerant phase detector. The phase offset signal may be either a voltage or a current having an average value proportional to a phase difference between the input data signal and the local clock signal. A linear gain of the phase detector 210 may be a proportionality constant relating the phase difference to the actual phase offset signal. In some embodiments, the phase detector 210 may be a charge-pump based phase detector. Of course, one skilled in the pertinent art will understand that the phase detector 210 may also be a non-linear phase detector.

The first delay line 220 and the second delay line 230 are continuously controllable delay lines that produce respective first and second candidate local clock signals. The first delay element 224 and the second delay element 234 may be conventional delay components with linear transfer characteristics. More specifically, a phase delay time of the first delay element 224 and the second delay element 234 may equal a gain multiplied by a control signal. The gain may be an optimal gain of the first delay element 224 or the second delay element 234, respectively. The control signal, which may be a current or a voltage, may be the first or second control signal received from the first integrator 228 and the second integrator 238, respectively. Typically, the phase delay of the first delay element 224 or the second delay element 234 is greater than or equal to zero. In the local clock generating circuit 200, both the gain and the control signal may be positive. One skilled in the pertinent art will understand that there may be more than two delays in other embodiments.

The first integrator 228 and the second integrator 238 may be resettable integrators for determining a delay of the first delay line 220 and the second delay line 230, respectively. The first integrator 228 and the second integrator 238 may be reset by a selection signal. In one embodiment, the first integrator 228 may be reset with an inverted selection signal. A delay of the first delay line 220 and the second delay line 230 may be the phase delay time of the first delay element 224 and the second delay element 234. The first integrator 228 and the second integrator 238 may be conventional integrators which integrate, with a designated scale factor, the phase offset signal from the phase detector 210. In some embodiments, the first integrator 228 or the second integrator 238 may be single capacitors.

The delay line selector 240, coupled to the first delay line 220 and the second delay line 230, selects one of the first and second candidate local clock signals to be the local clock signal based on phase excursions in the input clock signal. In a preferred embodiment, the delay line selector 240 includes digital control circuitry. The cycle slip detector 242, the toggle flip-flop 244, the invertor 246 and the multiplexor 248 may be conventional digital components employed by the delay line selector 240. The cycle slip detector 242 may detect when an active first delay line 220 or second delay line 230 has reached a delay limit. An active delay line may be either the first delay line 220 or the second delay line 230 that has been selected to provide the first or second candidate local clock signal as the local clock signal. The delay limit may be one reference clock signal period, $T_{ref}$, when the first or second control signal is increasing or zero when the first or second control signal is decreasing.

The cycle slip detector 242 may determine the delay limit by monitoring the value of the first and second control signals or by monitoring the actual delay through the first delay line 220 or the second delay line 230. The toggle flip-flop 244 generates the selection signal based on the detection of the cycle slip detector 242. When detecting either of the above delay limits or slip conditions, the cycle slip detector 242 pulses the toggle flip-flop 244 which changes the flip-flop state.

The invertor 246 inverts the state of the selection signal from the toggle flip-flop 244 resulting in a reset signal to the first integrator 228. When the reset signal is asserted, the first integrator 228 resets and holds either a zero state or a reference period state. The zero state may result when the first or second control signal produces a zero delay when driving the first or second delay lines 220, 230. A reference period state is when the first or second control signal produces a delay of one reference clock signal period when driving the first or second delay lines 220, 230.

When the active delay line has a delay greater than about one-half the reference clock signal period, the idle or non-selected delay line will hold a reset state of zero. When the active delay line has a delay less than about one-half the reference clock signal period, the idle delay line will hold a reset state of the reference clock signal period. Typically, the one-half reference clock signal threshold comparison should incorporate some hysteresis. Additionally, a delay of zero is actually the minimum achievable delay, and a delay of one reference clock signal period is actually a delay of one reference clock signal period plus the minimum achievable delay. In other words, a finite minimum delay may be present as an offset. This offset delay, however, has essentially no effect on the behavior of the local clock generating circuit 200. For convenience in these discussions, therefore, the first delay element 224 and the second delay element 234 have a minimum delay of zero.

The multiplexor 248 selects one of the first and second candidate local clock signals based on a state of the selection signal. The states of the selection signal may be "1" and "0." For example, when the selection signal is "1", the second delay line 230 may be selected as the active delay line. When the selection signal is "0", the first delay line 220 may be selected as the active delay line. Of course, one skilled in the pertinent art will understand that a candidate local clock signal may be selected by another process employing other components.

The phase detector 210 and the first and second integrator, 228, 238, will cause a reference clock feeding through the first and second delay elements, 224, 234, to track the movement of the input clock signal. The reference clock signal may be a fixed frequency signal generated by a conventional reference clock source. When a frequency of the input clock signal is less than a frequency of the reference clock signal, the local clock generating circuit 200 will have the tendency to move the delay of the first and second delay lines 220, 230, forward. In other words, the local clock generating circuit 200 may ramp up the first or second control signal on the active delay line. When the input clock signal frequency is greater than the reference clock signal frequency, the local clock generating circuit 200 will have the tendency to move the delay of the 220, 230 backwards. More specifically, the local clock generating circuit 200 may decrease the delay in the delay lines 220, 230, by ramping down the control signal on the active delay line. If the frequencies of the input clock signal and the reference clock signal are equal, the local clock generating circuit 200 will push the active delay line out to match the phase of the input clock signal, and then hold this state.

Figure 3A:
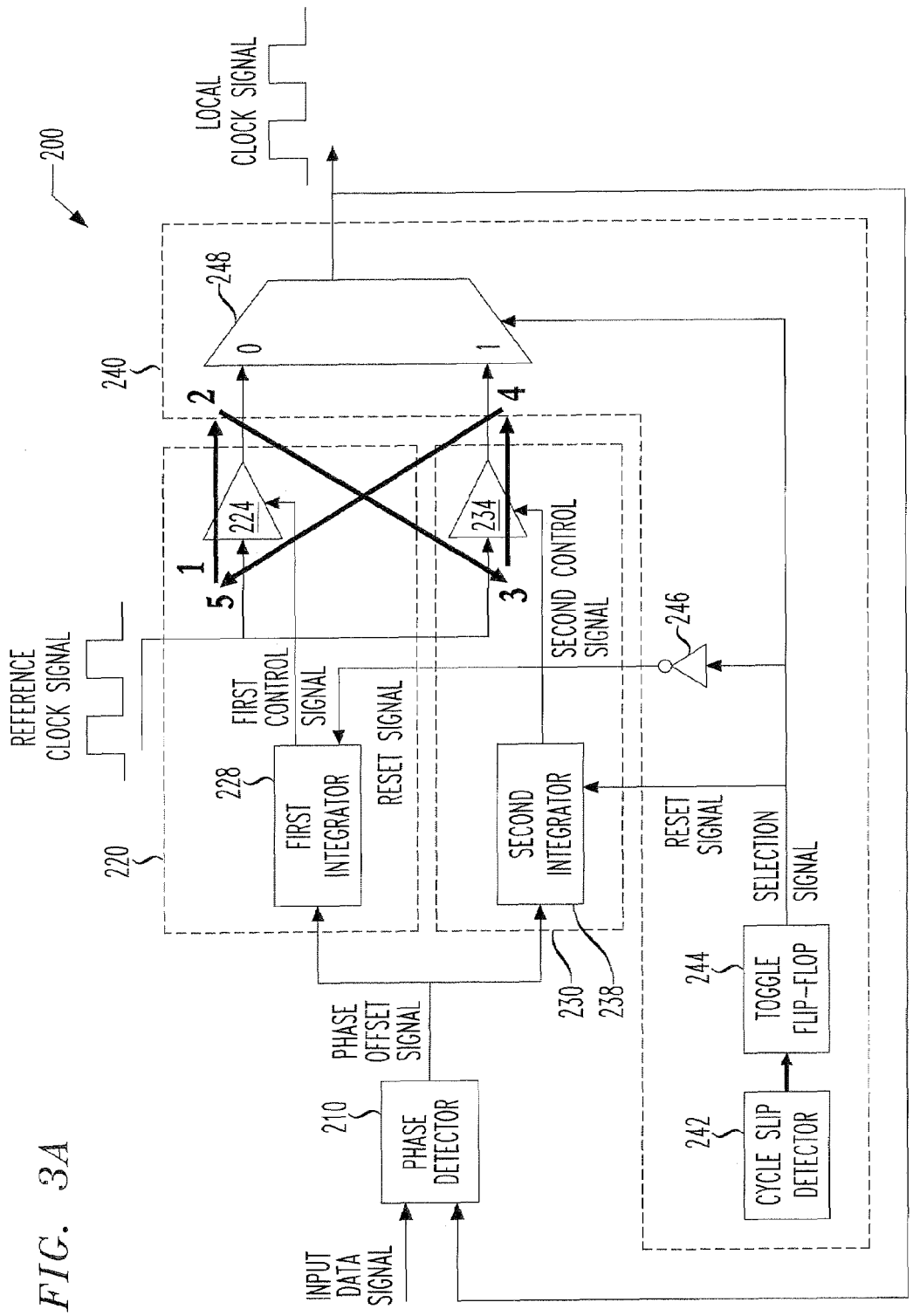
FIGS. 3A and 3B together illustrate the local clock generating circuit of FIG. 2 operating under conditions of excess (FIG. 3A) and deficient (FIG. 3B) reference clock frequency.
Figure 3B:
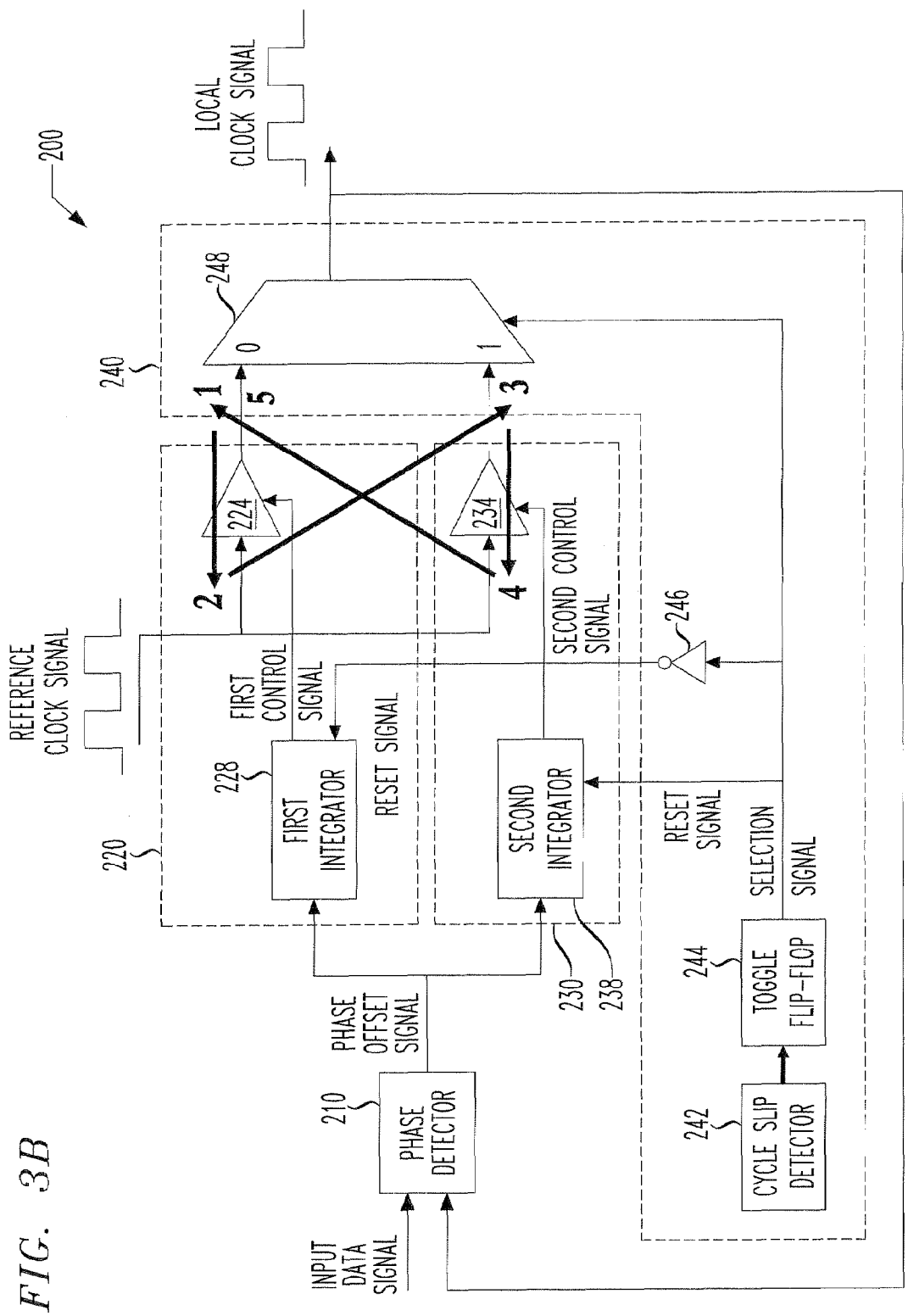

Turning now to FIGS. 3A and 3B, illustrated are the local clock generating circuit of FIG. 2 operating under conditions of excess (FIG. 3A) and deficient (FIG. 3B) reference clock signal frequency. FIGS. 3A and 3B illustrate how the local clock signal precesses around the first and second candidate clock signals for the local clock generating circuit having a positive gain. Starting with FIG. 3A, the input data signal frequency is less than the reference clock signal frequency. At any designated time, therefore, the first or second control signal may be increasing. At Sequence Point 1, the first delay line 220 is the active delay line, the selection signal is zero and the first candidate local clock signal is selected as the local clock signal. The increasing control signal increases the delay of the first delay line 220 forward. At Sequence Point 2, the delay of the first delay line 220 has been moved forward such that the delay limit, $T_{ref}$, is detected by the cycle slip detector 242 causing the toggle flip-flop 244 to change the selection signal from a zero to a one. Accordingly, the reset signal via the invertor 246 resets the first integrator to the zero reset state.

At Sequence Point 3, the second delay line 230 is the active delay line and the second candidate local clock signal is selected as the local clock signal. The first delay line 220 is idle and holding the reset state of zero. The delay of the second delay line 230 continues to increase as controlled by the second control signal. At Sequence Point 4, the delay of the first delay line 220 has been moved forward such that the delay limit, $T_{ref}$, is detected by the cycle slip detector 242 causing the toggle flip-flop 244 to change the selection signal from a one to a zero. Accordingly, the reset signal via the selection signal resets the second integrator 238 to a zero reset state. At Sequence Point 5, the first delay line 220 is once again the active delay line and the first candidate local clock signal is selected as the local clock signal. The second delay line 230 is idle holding the reset state of zero. The local clock generating circuit 200 then continues as described.

Referring now to FIG. 3B, the input data signal frequency is greater than the reference clock signal frequency. At any designated time, therefore, the first or second control signal may be decreasing. At Sequence Point 1, the first delay line 220 is the active delay line, the selection signal is zero and the first candidate local clock signal is selected as the local clock signal. The decreasing control signal decreases the delay of the first delay line 220. At Sequence Point 2, the delay limit, zero, is detected by the cycle slip detector 242 causing the toggle flip-flop 244 to change the selection signal from a zero to a one. Accordingly, the reset signal through the inverter 246 resets the first integrator to the $T_{ref}$ state.

At Sequence Point 3, the second delay line 230 is the active delay line, the selection signal is one and the second candidate local clock signal is selected as the local clock signal. The first delay line 220 is idle holding the reset state of $T_{ref}$. The delay of the second delay line 230 continues to decrease as controlled by the second control signal. At Sequence Point 4, the cycle slip detector 242 detects a delay limit of zero causing the toggle flip-flop 244 to change the selection signal from a one to a zero. Accordingly, the second integrator 238 is reset to the reset state $T_{ref}$ by the reset signal via the selection signal from the toggle flip-flop 244. At Sequence Point 5, the first delay line 220 is once again the active delay line and the first candidate local clock signal is selected as the local clock signal. The second delay line 230 is in idle holding the reset state $T_{ref}$. The local clock generating circuit 200 then continues as described.

Figure 4:
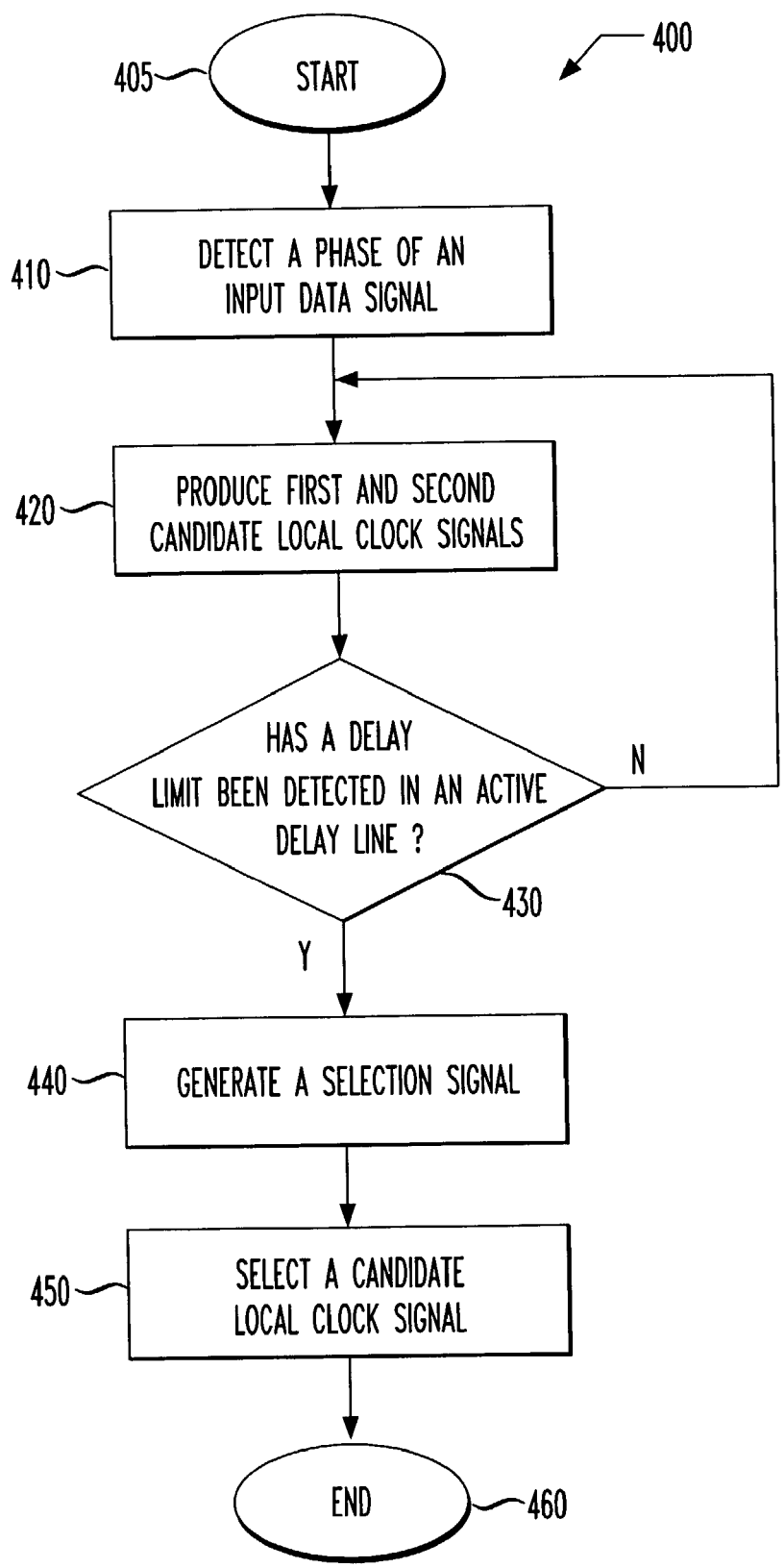
FIG. 4 illustrates a flow diagram of a method of generating a local clock signal carried out according to the principles of the present invention.

Turning now to FIG. 4, illustrated is a flow diagram of a method, generally designated 400, of generating a local clock signal carried out according to the principles of the present invention. The method starts in a step 405 with an intent to generate a local clock signal.

After starting, a phase of an input data signal is detected in a step 410. The input data signal may be a input clock signal or a random data signal with an input clock signal embedded therein. Detecting the phase may include producing a phase offset signal based on both the input data signal and the local clock signal. The phase of the input data signal may be detected by a conventional phase detector. In one embodiment, the phase detector may be a charge-pump based phase detector.

After detecting a phase of an input data signal, first and second continuously controllable delay lines are employed to produce respective first and second candidate local clock signals in a step 420. In one embodiment, the first continuously controllable delay line may initially be an active delay line. The first and second continuously controllable delay lines may include a resettable integrator for determining a delay therein. In one embodiment, the resettable integrators may be capacitors.

After producing the first and second delay lines, a determination is made if a delay limit has been detected in an active delay line in a decisional step 430. The active delay line is either the first or second delay line that has been selected to provide the respective first or second candidate local clock signal as the local clock signal. For example, if the first delay line is the active delay line, then a determination is made if the first delay line has reached a delay limit. In some embodiments, the delay limit may be $T_{ref}$. In other embodiments, the delay limit may be zero. The delay limit may be detected by employing a cycle slip detector.

After determining that a delay limit has been detected, a selection signal is generated in a step 440. The selection signal may be a voltage or a current. The selection signal may indicate to select an idle delay line. In one embodiment, the selection signal may be generated by a digital component such as a toggle flip-flop.

After generating a selection signal, a candidate local clock signal is selected to be the local clock signal in a step 450. A multiplexor may be employed to select the candidate local clock signal based on a state of the selection signal. After selecting a candidate local clock signal, generating a local clock signal ends in a step 460. Returning now to the decisional step 430, if it is determined that a delay limit has not been detected in an active delay line, then the method 400 proceeds to step 420 and continues as before.

Although the present invention has been described in detail, those skilled in the art should understand that they can make various changes, substitutions and alterations herein without departing from the spirit and scope of the invention in its broadest form.

What is claimed is:

1. A circuit for generating a local clock signal, comprising:
   a phase detector for receiving an input data signal;
   first and second continuously controllable delay lines, coupled to said phase detector, for producing respective first and second candidate local clock signals, each of said first and second delay lines including a resettable integrator for determining a delay therein; and
   delay line selector, coupled to said first and second delay lines, for selecting one of said first and second candidate local clock signals to be said local clock signal based on phase excursions in said input data signal and including a cycle slip detector for detecting when an active one of said first and second delay lines has reached a delay limit, wherein said delay line selector employs a selection signal to reset said resettable integrator in a nonselected one of said first and second delay lines.

2. The circuit as recited in claim 1 wherein said phase detector is a linear phase detector that produces a phase offset signal based on both said input data signal and said local clock signal.

3. The circuit as recited in claim 1 wherein said delay line selector comprises a flip-flop for generating said selection signal.

4. The circuit as recited in claim 1 wherein said delay line selector comprises a multiplexer for selecting said one of said first and second candidate local clock signals based on a state of said selection signal.

5. A method of generating a local clock signal, comprising:
   detecting a phase of an input data signal;
   employing first and second continuously controllable delay lines to produce respective first and second candidate local clock signals, wherein each of said first and second delay lines comprises a resettable integrator for determining a delay therein;
   detecting when an active one of said first and second delay lines has reached a delay limit; and selecting one of said first and second candidate local clock signals to be said local clock signal based on phase excursions in said input data signal, wherein said selecting comprises resetting said resettable integrator in a nonselected one of said first and second delay lines.

6. The method as recited in claim 5 wherein said detecting comprises producing a phase offset signal based on both said input data signal and said local clock signal.

7. The method as recited in claim 5 wherein said selecting comprises generating a selection signal.

8. The method as recited in claim 5 wherein said selecting comprises employing a multiplexer to select said one of said first and second candidate local clock signals based on a state of a selection signal.

9. A synchronous telecommunications system, comprising:
   circuitry for receiving an input data signal from a remote source, said input data signal subject to excess jitter;
   a phase detector for detecting a phase of said input data signal;
   first and second continuously controllable delay lines, coupled to said phase detector, for producing respective first and second candidate local clock signals, wherein each of said first and second delay lines includes a resettable integrator for determining a delay therein;
   delay line selector, coupled to said first and second delay lines and including a cycle slip detector for detecting when an active one of said first and second delay lines has reached a delay limit, for selecting one of said first and second candidate local clock signals to be said local clock signal based on phase excursions in said input data signal, said phase detector comparing a phase of said local clock signal to said phase of said input data signal to yield a phase offset signal indicating said phase excursions, said local clock signal having less of said jitter, wherein said delay line selector employs a selection signal to reset said resettable integrator in a nonselected one of said first and second delay lines; and
   data processing circuitry for processing said input data signal based on said local clock signal.

10. The system as recited in claim 9 wherein said phase detector is a linear phase detector that produces a phase offset signal based on both said input data signal and said local clock signal.

11. The system as recited in claim 9 wherein said delay line selector comprises a flip-flop for generating said selection signal.

12. The system as recited in claim 9 wherein said delay line selector comprises a multiplexer for selecting said one of said first and second candidate local clock signals based on a state of said selection signal.

13. A circuit for generating a local clock signal, comprising:

a phase detector for receiving an input data signal;
first and second continuously controllable delay lines, coupled to said phase detector, for producing respective first and second candidate local clock signals, wherein each of said first and second delay lines includes a resettable integrator for determining a delay therein; and
delay line selector, coupled to said first and second delay lines, for selecting one of said first and second candidate local clock signals to be said local clock signal based on phase excursions in said input data signal, said delay line selector employing a selection signal to reset said resettable integrator in a nonselected one of said first and second delay lines.

14. A method of generating a local clock signal, comprising:
   detecting a phase of an input data signal;
   employing first and second continuously controllable delay lines to produce respective first and second candidate local clock signals, wherein each of said first and second delay lines includes a resettable integrator for determining a delay therein;
   selecting one of said first and second candidate local clock signals to be said local clock signal based on phase excursions in said input data signal; and
   resetting said resettable integrator in a nonselected one of said first and second delay lines.

15. A synchronous telecommunications system, comprising:
   circuitry for receiving an input data signal from a remote source, said input data signal subject to excess jitter;
   a phase detector for detecting a phase of said input data signal;
   first and second continuously controllable delay lines, coupled to said phase detector, for producing respective first and second candidate local clock signals, wherein each of said first and second delay lines includes a resettable integrator for determining a delay therein;
   delay line selector, coupled to said first and second delay lines, for selecting one of said first and second candidate local clock signals to be said local clock signal based on phase excursions in said input data signal, said phase detector comparing a phase of said local clock signal to said phase of said input data signal to yield a phase offset signal indicating said phase excursions, said local clock signal having less of said jitter, and wherein said delay line selector employs a selection signal to reset said resettable integrator in a nonselected one of said first and second delay lines and; and
   data processing circuitry for processing said input data signal based on said local clock signal.

* * * * *